(12) United States Patent
Shen et al.

(10) Patent No.: US 12,356,633 B2
(45) Date of Patent: Jul. 8, 2025

(54) SEMICONDUCTOR DEVICES AND METHOD OF FORMING THE SAME

(71) Applicant: Taiwan Semiconductor Manufacturing Company, Ltd., Hsinchu (TW)

(72) Inventors: Hsiang-Ku Shen, Hsinchu (TW); Liang-Wei Wang, Hsinchu (TW); Dian-Hau Chen, Hsinchu (TW); Yen-Ming Chen, Hsin-Chu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/347,536

(22) Filed: Jul. 5, 2023

(65) Prior Publication Data
US 2023/0354614 A1    Nov. 2, 2023

Related U.S. Application Data

(63) Continuation of application No. 17/364,862, filed on Jun. 30, 2021, now Pat. No. 11,744,084.

(60) Provisional application No. 63/156,947, filed on Mar. 5, 2021.

(51) Int. Cl.
*H10B 61/00* (2023.01)
*H01L 21/762* (2006.01)
*H01L 23/48* (2006.01)
*H01L 23/522* (2006.01)
*H10D 64/01* (2025.01)

(52) U.S. Cl.
CPC ....... *H10B 61/22* (2023.02); *H01L 21/76224* (2013.01); *H01L 23/481* (2013.01); *H01L 23/5226* (2013.01); *H10D 64/01* (2025.01)

(58) Field of Classification Search
CPC . H10B 61/22; H01L 27/228; H01L 21/76224; H01L 23/481; H01L 23/5226; H01L 29/401
USPC .......................................................... 257/379
See application file for complete search history.

(56) References Cited

U.S. PATENT DOCUMENTS

2015/0060967 A1*  3/2015  Yokoyama ........ H01L 27/14612
                                                        257/295
2015/0061020 A1*  3/2015  Yokoyama .......... H01L 27/1211
                                                        438/666

* cited by examiner

*Primary Examiner* — Tu-Tu V Ho
(74) *Attorney, Agent, or Firm* — JCIPRNET

(57) ABSTRACT

A semiconductor device includes a substrate, a gate structure, a source region and a drain region, a conductive via and an isolation structure. The gate structure is disposed over the substrate. The source region and the drain region aside the gate structure. The conductive via is disposed in the substrate. The isolation structure is disposed in the substrate, wherein a first surface of the isolation structure is substantially flush with a first surface of the conductive via.

20 Claims, 10 Drawing Sheets

SEMICONDUCTOR DEVICES AND METHOD OF FORMING THE SAME

CROSS-REFERENCE TO RELATED APPLICATION

This application is a continuation application of and claims the priority benefit of a prior application Ser. No. 17/364,862, filed on Jun. 30, 2021 and now allowed, which claims the priority benefit of U.S. provisional application Ser. No. 63/156,947, filed on Mar. 5, 2021. The entirety of the above-mentioned patent application is hereby incorporated by reference herein and made a part of this specification.

BACKGROUND

Some integrated circuit manufacturing processes include manufacturing steps associated with making data storage circuit elements. Data storage elements such as Dynamic Random Access Memory (DRAM), Static Random Access Memory (SRAM) and flash memory (a form of non-volatile memory), place data storage circuit elements in an integrated circuit in tightly-packed arrays of elements, to minimize the amount of die area occupied by data storage elements. Magnetoresistive Random Access Memory (MRAM) is a type of data storage element in which information is stored based on the orientation of a magnetic field in a circuit element. MRAM uses the magnetic field to store information rather than the presence/absence of electrical charge in a storage circuit element, or with the quantity of electronic charge stored in a data storage circuit element.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
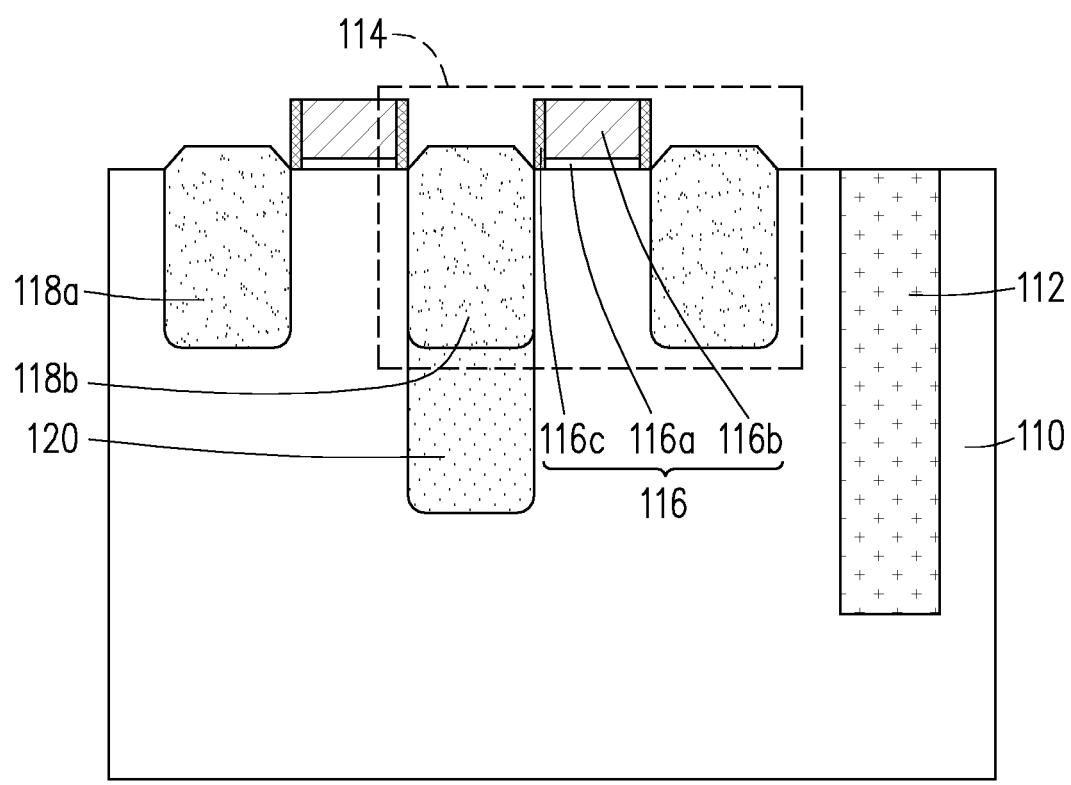
FIG. 1A to FIG. 1H are schematic cross sectional views of various stages in a method of manufacturing a semiconductor device according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A to FIG. 1H are schematic cross sectional views of various stages in a method of manufacturing a semiconductor device according to some embodiments. In some embodiments, the semiconductor manufacturing method is part of a packaging process.

Referring to FIG. 1A, a semiconductor substrate 110 is provided. In some embodiments, the semiconductor substrate 110 is a bulk semiconductor substrate. A "bulk" semiconductor substrate refers to a substrate that is entirely composed of at least one semiconductor material. In some embodiments, the bulk semiconductor substrate includes a semiconductor material or a stack of semiconductor materials such as silicon (Si), germanium (Ge), silicon germanium (SiGe), carbon doped silicon (Si:C), silicon germanium carbon (SiGeC); or an III-V compound semiconductor such as gallium arsenide (GaAs), gallium phosphide (GaP), indium phosphide (InP), indium arsenide (InAs), indium antimonide (InSb), gallium arsenide phosphide (GaAsP), aluminum indium arsenide (AlInAs), aluminum gallium arsenide (AlGaAs), gallium indium arsenide (GaInAs), gallium indium phosphide (GaInP), or gallium indium arsenide phosphide (GaInAsP). In some embodiments, the bulk semiconductor substrate includes a single crystalline semiconductor material such as single crystalline silicon. In some embodiments, the bulk semiconductor substrate is doped depending on design requirements. In some embodiments, the bulk semiconductor substrate is doped with p-type dopants or n-type dopants. The term "p-type" refers to the addition of impurities to an intrinsic semiconductor that creates deficiencies of valence electrons. Exemplary p-type dopants, i.e., p-type impurities, include, but are not limited to, boron, aluminum, gallium, and indium. "N-type" refers to the addition of impurities that contribute free electrons to an intrinsic semiconductor. Exemplary n-type dopants, i.e., n-type impurities, include, but are not limited to, antimony, arsenic, and phosphorous. If doped, the semiconductor substrate 110, in some embodiments, has a dopant concentration in a range from $1.0 \times 10^{14}$ atoms/cm$^3$ to $1.0 \times 10^{17}$ atoms/cm$^3$, although the dopant concentrations may be greater or smaller. In some embodiments, the semiconductor substrate 110 is a semiconductor-on-insulator (SOI) substrate including a top semiconductor layer formed on an insulator layer (not shown). The top semiconductor layer includes the above-mentioned semiconductor material such as Si, Ge, SiGe, Si:C, SiGeC; or an III-V compound semiconductor including GaAs, GaP, InP, InAs, InSb, GaAsP, AlInAs, AlGaAs, GaInAs, GaInP, or GaInASP. The insulator layer is, for example, a silicon oxide layer, or the like. The insulator layer is provided over a base substrate, typically a silicon or glass substrate.

Then, a plurality of active devices 114 may be formed in and over the semiconductor substrate 110. In some embodiments, a plurality of isolation structures 112 are formed in the semiconductor substrate 110 to define an active area where the active devices D2 are formed. The active device 114 may include a gate structure 116, a source region 118a and a drain region 118b at opposite sides of the gate structures 116. The gate structure 116 may include a gate dielectric layer 116a, a gate electrode 116b on the gate dielectric layer 116a and spacers 116c on opposite sidewalls of the gate dielectric layer 116a and the gate electrode 116b. In some embodiments, the gate dielectric layer 116a includes an oxide, a metal oxide, the like, or combinations thereof. The gate electrode 116b may include a metal-containing material such as titanium nitride, titanium oxide, tantalum nitride, tantalum carbide, cobalt, ruthenium, aluminum, tungsten, combinations thereof, or multi-layers thereof. The source region 118a and the drain region 118b may be epitaxial source and drain regions epitaxially grown in a recess (not shown) of the semiconductor substrate 110 using a process such as chemical vapor deposition (CVD), atomic layer deposition (ALD), vapor phase epitaxy (VPE), molecular beam epitaxy (MBE), or the like. Top surfaces of the source region 118a and the drain region 118b may be protruded from or substantially flush with a surface of the semiconductor substrate 110, and bottom surfaces of the source region 118a and the drain region 118b may be substantially flush with each other. The source region 118a and the drain region 118b may have a thickness in a range between about 30 nm and about 50 nm. When the source region 118a and the drain region 118b are in an n-type region, e.g., the NMOS region, the source region 118a and the drain region 118b may include any acceptable material appropriate for n-type FETs. For example, the source region 118a and the drain region 118b include silicon, silicon carbide, phosphorous doped silicon carbide, silicon phosphide, or the like. When the source region 118a and the drain region 118b are in a p-type region, e.g., the PMOS region, the source region 118a and the drain region 118b may include any acceptable material appropriate for p-type FETs. For example, the source region 118a and the drain region 118b include silicon-germanium, boron doped silicon-germanium, germanium, germanium tin, or the like.

In alternative embodiments, the active device 114 is a nano-FET, and the active device 114 further includes nanostructures (not shown) under the gate structure 116. The nanostructures may form channel regions of nano-FETs. For example, some nanostructures are formed of a first semiconductor material suitable for p-type nano-FETs, such as silicon germanium or the like, and some nanostructures are formed of a second semiconductor material suitable for n-type nano-FETs, such as silicon, silicon carbon, or the like.

In some embodiments, the semiconductor substrate 110 further includes an epitaxial material 120 below one of the source region 118a and the drain region 118b. For example, the epitaxial material 120 is formed below the drain region 118b. The epitaxial material 120 may have a thickness in a range between about 50 nm and about 100 nm. A ratio of the thickness of the epitaxial material 120 to the thickness of the drain region 118b may be in a range of 1 to 2. In some embodiments, the epitaxial material 120 is a sacrificial material (also referred to as a dummy material), which is subsequently removed to form a backside via (such as the backside via 170, discussed below with respect to FIG. 1G). A top surface of the epitaxial material 120 may be level with bottom surfaces of the drain region 118b and the source region 118a. The epitaxial material 120 may be epitaxially grown in a recess (not shown) of the semiconductor substrate 110 using a process such as chemical vapor deposition (CVD), atomic layer deposition (ALD), vapor phase epitaxy (VPE), molecular beam epitaxy (MBE), or the like. The epitaxial material 120 may include any acceptable material, such as silicon germanium or the like. The epitaxial material 120 may be formed of materials having high etch selectivity to materials of the drain region 118b, the semiconductor substrate 110, and dielectric layers (such as the isolation structure 112 and dielectric layer 162, discussed below with respect to FIG. 1D). As such, the epitaxial material 120 may be removed and replaced with the backside via without significantly removing the drain region 118b and the dielectric layers.

Figure 1B:
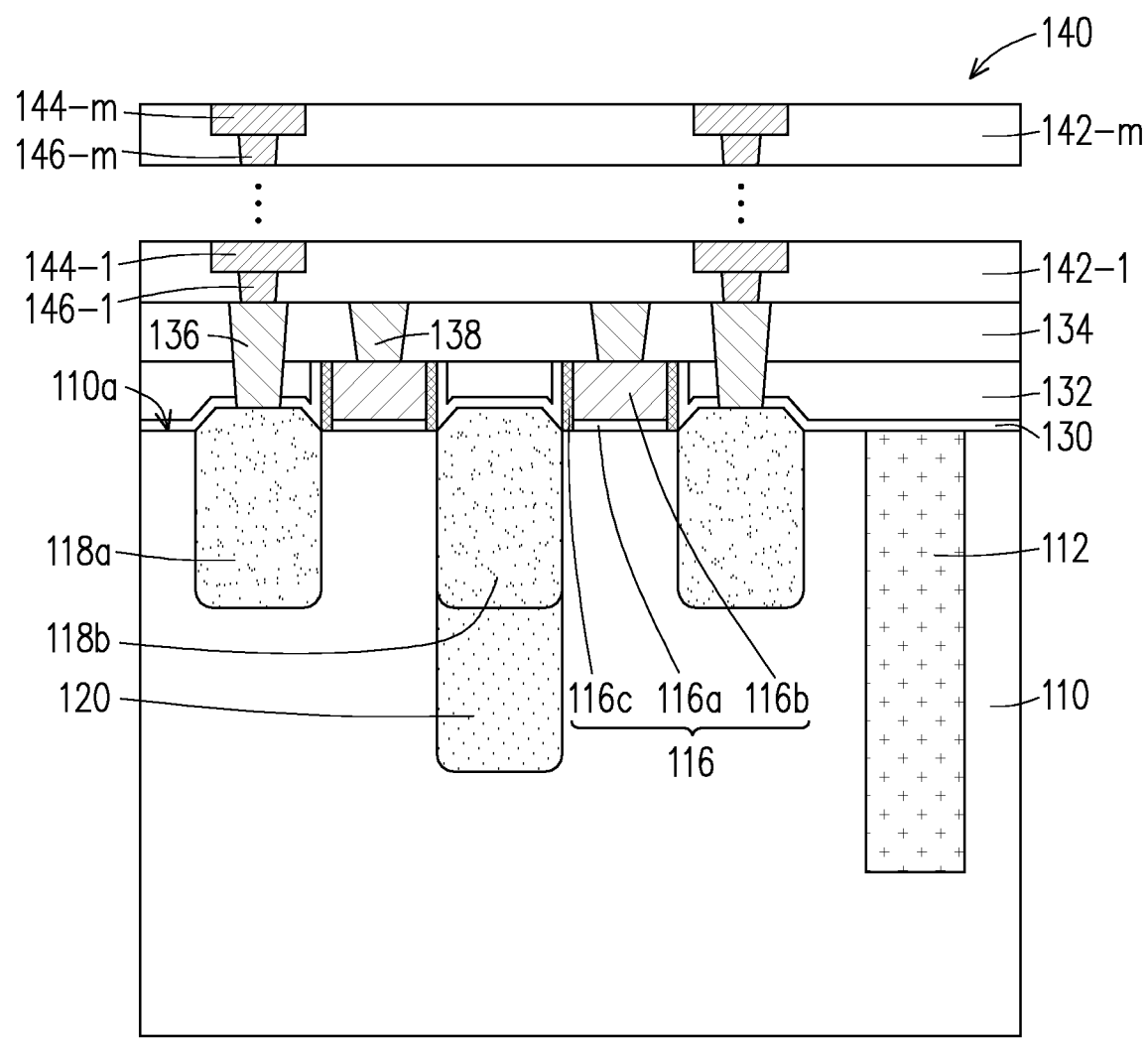

Referring to FIG. 1B, an interconnect structure 140 is formed at a first side (e.g., front-side) 110a of the semiconductor substrate 110. The interconnect structure 140 may include a plurality of dielectric layers 132, 134, 142-1, . . . , 142-m, a plurality of interconnect wirings 144-1, . . . , 144-m and a plurality of conductive vias 146-1, . . . , 146-m interconnecting the interconnect wirings 144-1, . . . , 144-m. In some embodiments, m is a positive integer larger than 12. For example, m is between 16-19. However, it should be appreciated that the interconnect structure 140 may include any number of interconnect wirings disposed in any number of dielectric layers. In some embodiments, the dielectric layer 132 is formed over the first side 110a of the semiconductor substrate 110. In some embodiments, the dielectric layer 132 includes silicon oxide. Alternatively, in some embodiments, the dielectric layers 132 includes a low-k dielectric material having a dielectric constant (k) less than 4. In some embodiments, the low-k dielectric material has a dielectric constant from about 1.2 to about 3.5. In some embodiments, the dielectric layer 132 includes TEOS formed oxide, undoped silicate glass, or doped silicate glass such as BPSG, FSG, PSG, BSG, and/or other suitable dielectric materials. In some embodiments, the dielectric layer 132 is deposited by CVD, PECVD, PVD, spin coating, the like, or a combination thereof. In some embodiments, the dielectric layer 132 is deposited to have a top surface above the top surface of the gate structures 116. The dielectric layer 132 is subsequently planarized, for example, by CMP and/or a recess etch using the gate structures 116 as a polishing and/or etch stop. After the planarization, the dielectric layer 132 has a surface substantially coplanar with the top surface of the gate structures 116.

In some embodiments, a contact etch stop layer (CESL) 130 is formed over the first side 110a of the semiconductor substrate 110. For example, the CESL 130 is disposed between the dielectric layer 132 and the source region 118a, between the dielectric layer 132 and the drain region 118b and between the dielectric layer 132 and the spacers 116c. The CESL 130 may include a dielectric material, such as, silicon nitride, silicon oxide, silicon oxynitride, or the like, having a different etch rate than the material of the overlying dielectric layer 132. In some embodiments, the gate structure 116 is formed by a gate-first process. However, the disclosure is not limited thereto. In alternative embodiments, the gate structure 116 is formed by a gate-last process, and the replacement process is performed after forming the dielectric layer 132. In some embodiments, top surfaces of the gate electrode 116b, the spacers 116c, the dielectric layer 132 and the CESL 130 are substantially coplanar.

In some embodiments, after forming the dielectric layer 132, a dielectric layer 134 is formed to cover the dielectric layer 132. In some embodiments, the dielectric layer 134 includes silicon oxide. Alternatively, in some embodiments, the dielectric layer 134 includes a low-k dielectric material having a dielectric constant (k) less than 4. In some embodiments, the low-k dielectric material has a dielectric constant from about 1.2 to about 3.5. In some embodiments, the dielectric layer 134 includes TEOS formed oxide, undoped silicate glass, or doped silicate glass such as BPSG, FSG, PSG, BSG, and/or other suitable dielectric materials. In some embodiments, the dielectric layer 134 is formed by CVD, PECVD, PVD, spin coating, the like, or a combination thereof. In some embodiments, the dielectric layer 132 and the dielectric layer 134 are patterned to form openings for exposing portions of the drain region 118*b* and the source region 118*a* and the gate structures 116. Then, a conductive material is formed to fill the opening defined in the dielectric layer 132 and the dielectric layer 134. An optional diffusion barrier and/or optional adhesion layer may be deposited in the openings before filled with the conductive material. Suitable materials for the barrier layer include titanium, titanium nitride, titanium oxide, tantalum, tantalum nitride, titanium oxide, combinations thereof, or the like, and suitable materials for the conductive material include copper, silver, gold, tungsten, aluminum, combinations thereof, or the like. A chemical mechanical planarization (CMP) process or the like may be used to remove excess conductive material, so as to form a gate contact 138 and a source contact 136. In some embodiments, the gate contact 138 is in contact with the gate structure 116 and the source contact 136 is in contact with the source region 118*a*. A material of the gate contact 138 and the source contact 136 may include aluminum, titanium, copper, nickel, tungsten, and/or alloys thereof. The gate contact 138 and the source contact 136 may be formed by electroplating, deposition, the like or a combination thereof. In an embodiment, the gate contact 138 and the source contact 136 may be formed by depositing a seed layer of copper or a copper alloy, and filling the openings by electroplating.

Then, the dielectric layers 142-1, . . . , 142-*m*, the interconnect wirings 144-1, . . . , 144-*m* and the conductive vias 146-1, . . . , 146-*m* interconnecting the interconnect wirings 144-1, . . . , 144-*m* are formed over the dielectric layers 134, for example. Each of the stacked dielectric layers 142-1, . . . , 142-*m* may include a dielectric material, such as a low-k dielectric material, an extra low-k (ELK) dielectric material, or the like. The dielectric layers 142-1, . . . , 142-*m* may be deposited using an appropriate process, such as, CVD, ALD, PVD, PECVD, or the like.

In some embodiments, the interconnect wirings 144-1, . . . , 144-*m* is also referred to as routings, conductive patterns, conductive features or conductive lines. In some embodiments, the interconnect wirings 144-1, . . . , 144-*m* and the conductive vias 146-1, . . . , 146-*m* are formed using a damascene process or a dual-damascene process. For example, a respective dielectric layer 142-1, . . . , 142-*m* is patterned utilizing a combination of photolithography and etching techniques to form trenches corresponding to the desired pattern of the interconnect wirings 144-1, . . . , 144-*m* and the conductive vias 146-1, . . . , 146-*m*. An optional diffusion barrier and/or optional adhesion layer may be deposited and the trenches may then be filled with a conductive material. Suitable materials for the barrier layer include titanium, titanium nitride, titanium oxide, tantalum, tantalum nitride, titanium oxide, combinations thereof, or the like, and suitable materials for the conductive material include copper, silver, gold, tungsten, aluminum, combinations thereof, or the like. In an embodiment, the interconnect wirings 144-1, . . . , 144-*m* and the conductive vias 146-1, . . . , 146-*m* are formed by depositing a seed layer of copper or a copper alloy, and filling the trenches by electroplating. A chemical mechanical planarization (CMP) process or the like may be used to remove excess conductive material from a surface of the respective dielectric layer 142-1, . . . , 142-*m* and to planarize surfaces of the dielectric layer 142-1, . . . , 142-*m* and the interconnect wirings 144-1, . . . , 144-*m* and the conductive vias 146-1, . . . , 146-*m* for subsequent processing.

In some embodiments, the interconnect structure 140 is also referred to as a front-side interconnect structure because it is formed on the front-side of the semiconductor substrate 110. The front-side interconnect structure 140 may be electrically connected to the gate contact 138 and the source contact 136 to form functional circuits. In some embodiments, the functional circuits formed by the front-side interconnect structure 140 may include logic circuits, memory circuits, image sensor circuits, or the like. For example, a source line (not shown) is electrically connected to the source contact 136 through the interconnect structure 140.

Figure 1C:
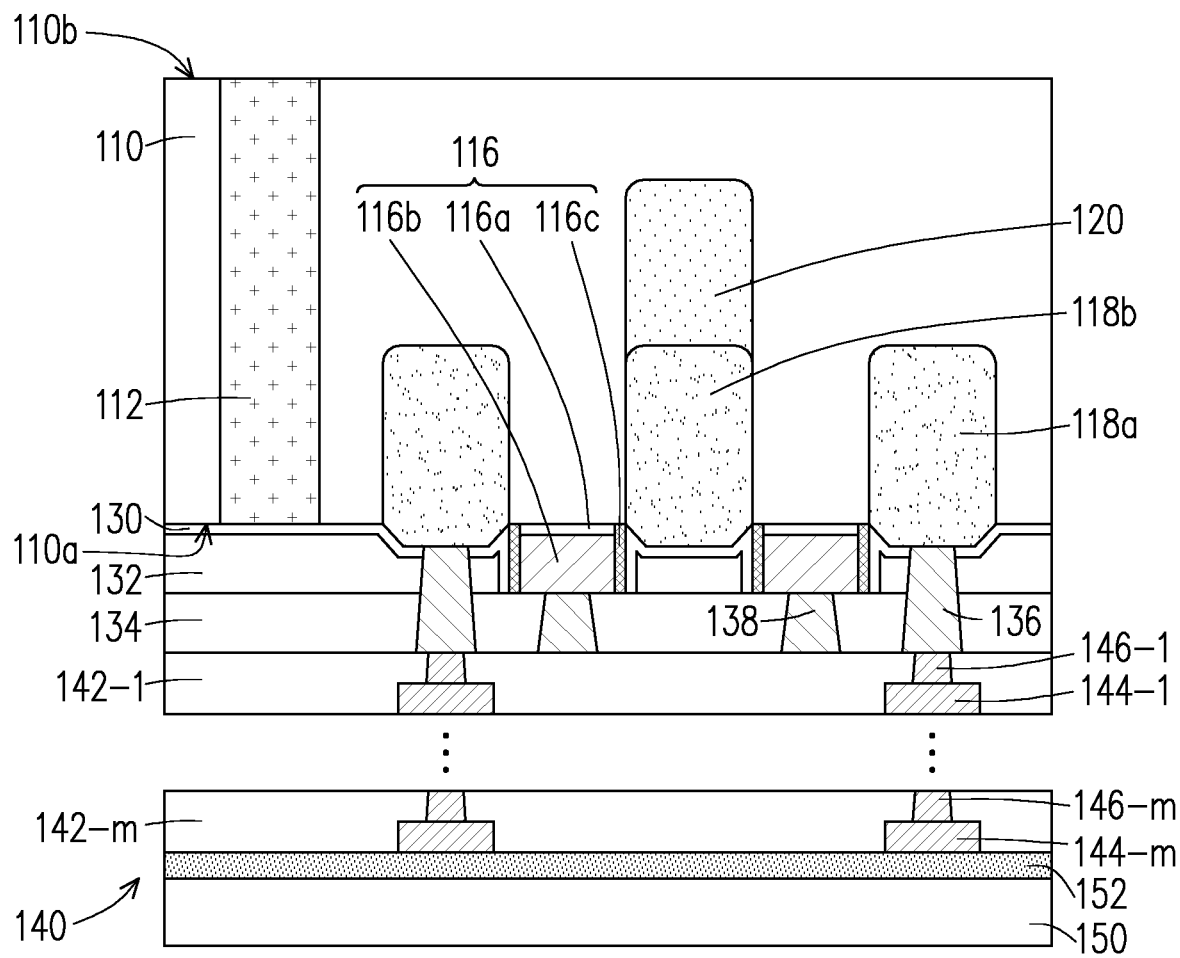

Referring to FIG. 1C, a carrier substrate 150 (also referred to as a carrier) is bonded to a top surface of the front-side interconnect structure 140 by a bonding layer 152. The carrier substrate 150 may be a glass carrier substrate, a ceramic carrier substrate, a wafer (e.g., a silicon wafer), or the like. The carrier substrate 150 may provide structural support during subsequent processing steps and in the completed device.

In some embodiments, the carrier substrate 150 is bonded to the front-side interconnect structure 140 using a suitable technique, such as dielectric-to-dielectric bonding, or the like. The dielectric-to-dielectric bonding may include depositing the bonding layer 152 on the front-side interconnect structure 140. In some embodiments, the bonding layer 152 include silicon oxide (e.g., a high density plasma (HDP) oxide, or the like) that is deposited by CVD, ALD, PVD, or the like. In alternative embodiments, a bonding layer may be formed on a surface of the carrier substrate 150 prior to bonding using, for example, CVD, ALD, PVD, thermal oxidation, or the like.

In some embodiments, after the carrier substrate 150 is bonded to the front-side interconnect structure 140, the device is flipped such that a second side (e.g., backside) 110*b* of the semiconductor substrate 110 faces upwards. The second side (e.g., backside) 110*b* of the semiconductor substrate 110 is opposite to the first side (e.g., front-side) 110*a* of the semiconductor substrate 110.

Then, portions of the semiconductor substrate 110 distal from the carrier substrate 150 are removed, to expose a surface of the isolation structure 112. The portions of the semiconductor substrate 110 may be removed by a planarization process (e.g., a CMP), an etch-back process, a combination thereof, or the like by using the surface of the isolation structure 112 as an endpoint. In some embodiments in which the semiconductor substrate 110 is a semiconductor-on-insulator (SOI) substrate including an insulator layer, the insulator layer is removed in this step. After the partial removal of the semiconductor substrate 110, surfaces of the semiconductor substrate 110 and the isolation structure 112 are level with each other.

Figure 1D:
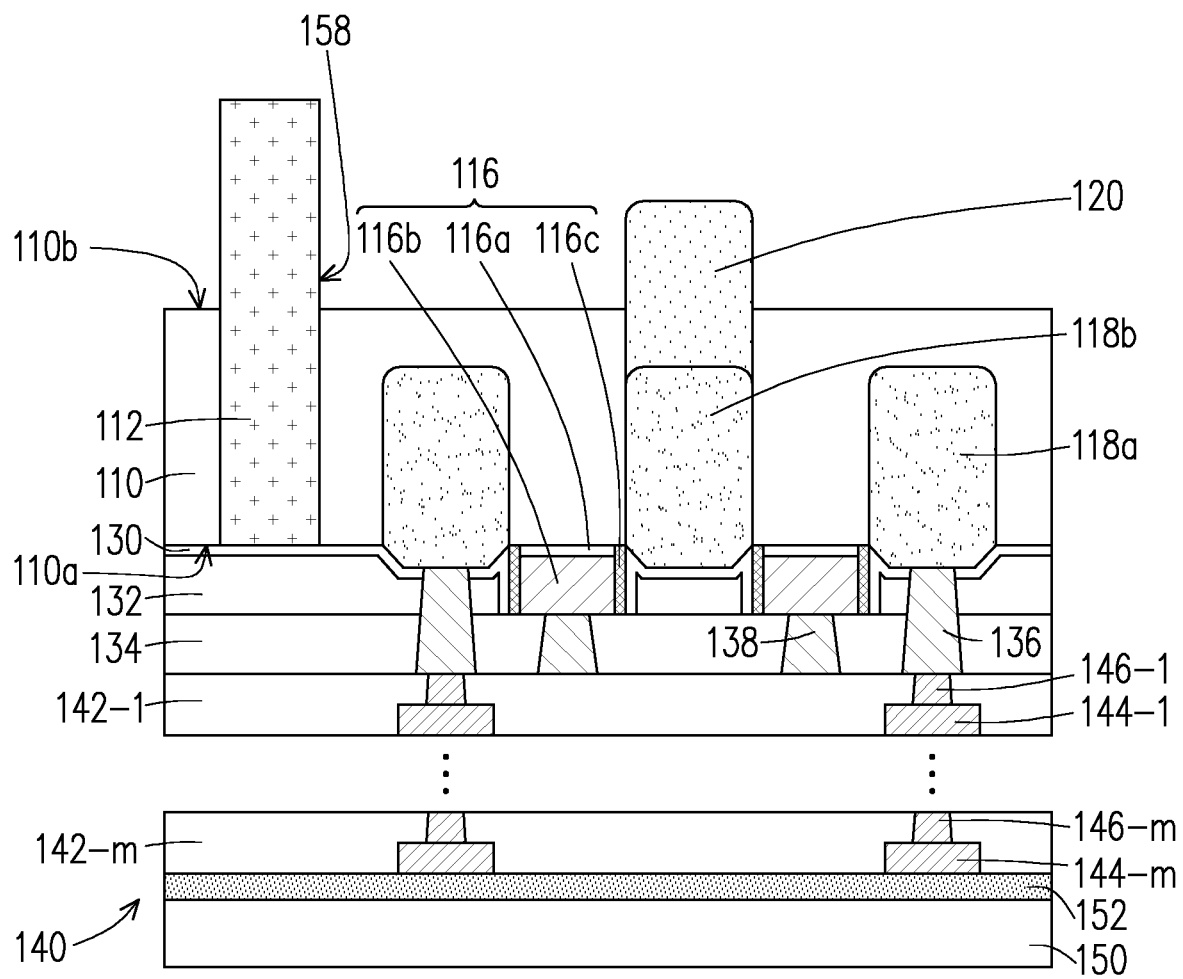

Referring to FIG. 1D, portions of the semiconductor substrate 110 are removed, to form recesses 158. In some embodiments, the portions of the semiconductor substrate 110 over the source region 118*a* and the drain region 118*b* are removed, and the recesses 158 are formed between the semiconductor substrate 110, the isolation structure 112 and the epitaxial material 120. The semiconductor substrate 110 may be etched using a suitable etching process, such as an etch-back process, an isotropic etching process (e.g., a wet etching process), an anisotropic etching process (e.g., a dry etching process), or the like. The etching process may be one that is selective to the material of the semiconductor substrate 110 (e.g., etches the material of the semiconductor substrate 110 at a faster rate than the material of the isolation structure 112, the source regions 118a, the drain regions 118b, and the epitaxial material 120). After partial removal of the semiconductor substrate 110, surfaces of the isolation structure 112 and the epitaxial material 120 may be exposed.

Figure 1E:
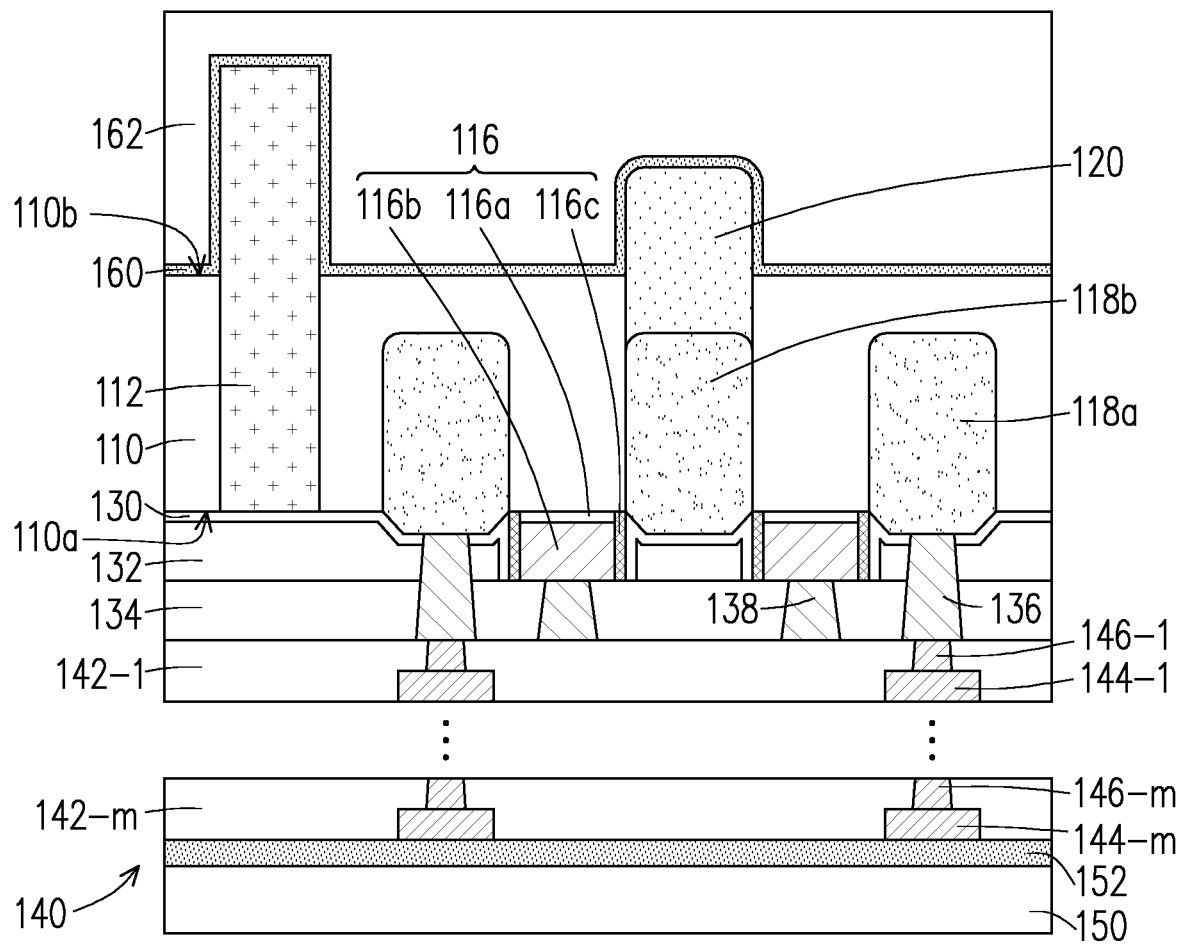

Referring to FIG. 1E, a dielectric layer 160 is formed over the exposed surfaces of the semiconductor substrate 110, the isolation structure 112 and the epitaxial material 120, and then a dielectric layer 162 is formed in the recesses 158. The dielectric layer 160 may physically contact the surfaces of the semiconductor substrate 110, the isolation structure 112 and the epitaxial material 120. The dielectric layer 160 may include a dielectric material, such as, silicon nitride, silicon oxide, silicon oxynitride, or the like, having a different etch rate from the material of the overlying dielectric layer 162. The dielectric layer 162 may be formed of a dielectric material such as PSG, BSG, BPSG, USG, or the like, and may be deposited by any suitable method, such as CVD, PECVD, or the like. In an embodiment, the dielectric layer 160 includes silicon nitride, and the dielectric layer 162 includes silicon oxide. In alternative embodiments, the dielectric layer 160 is omitted.

Figure 1F:
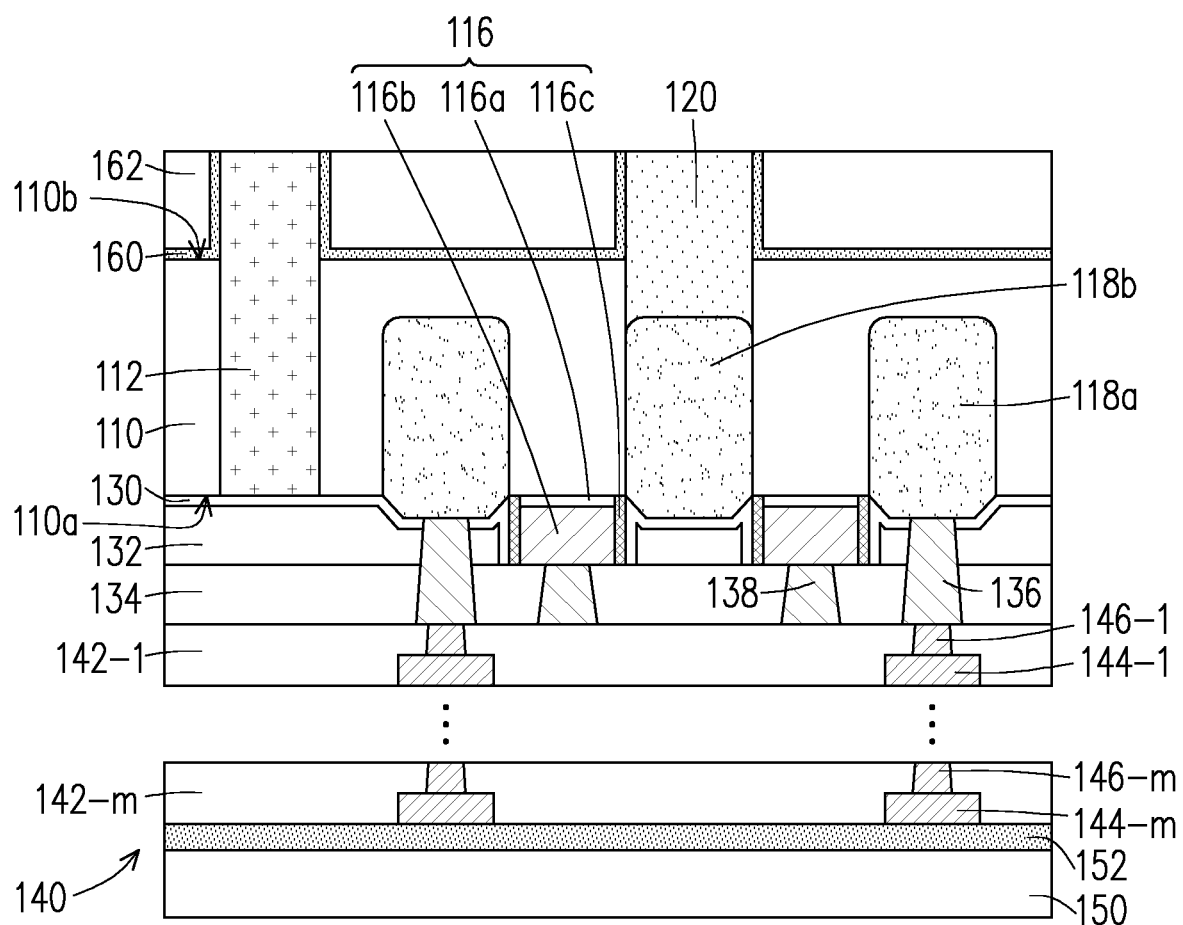

Referring to FIG. 1F, portions of the dielectric layers 160, 162 and the isolation structure 112 are removed by a planarization process, to expose a surface of the epitaxial material 120. The planarization process may be a CMP process or the like by using the surface of the epitaxial material 120 as an endpoint. After the planarization process, surfaces of the dielectric layers 160, 162 and the isolation structure 112 are level with the surface of the epitaxial material 120, and the surface of the epitaxial material 120 is exposed.

Figure 1G:
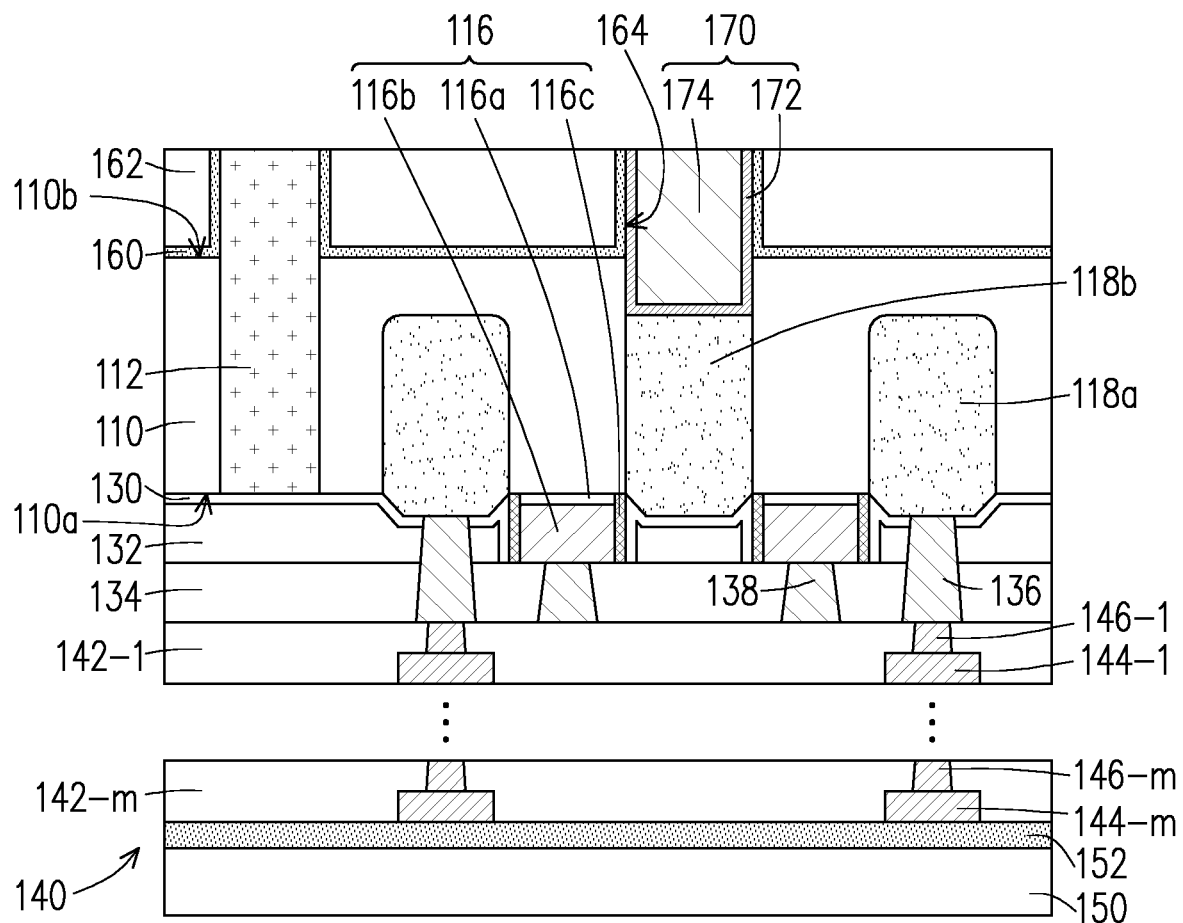

Referring to FIG. 1G, the epitaxial material 120 is removed to form a recess 164, and a backside via 170 is formed in the recess 164. The epitaxial material 120 may be removed by a suitable etching process, which may be an isotropic etching process, such as a wet etching process. The etching process may have a high etch selectivity to materials of the epitaxial material 120. As such, the epitaxial material 120 may be removed without significantly removing materials of the dielectric layers 160, 162, the isolation structure 112 or the drain region 118b. The recess 164 may expose a backside surface of the drain region 118b and sidewalls of the dielectric layer 160. In some embodiments, the backside via 170 includes a silicide layer 172 on sidewalls of the recess 164 and a metal layer 174 filling up the recess 164. The silicide layer 172 may include TiSi or the like. The metal layer 174 may include copper, aluminum, cobalt, tungsten, titanium, tantalum, ruthenium, an alloy thereof, or the like. In an embodiment, the silicide layer 172 includes TiSi, and the metal layer 174 includes ruthenium.

The backside via 170 is electrically connected to the drain region 118b. In some embodiments, the backside via 170 is in direct contact with the drain region 118b. The backside via 170 may be partially disposed in the semiconductor substrate 110, and the backside via 170 may be partially protruded from the second side 11b of the semiconductor substrate 110 and extended into the dielectric layer 162. In some embodiments, a first surface (e.g., top surface) of the backside via 170 is substantially flush with surfaces of the dielectric layer 162 and the isolation structure 112, and a second surface (e.g., bottom surface) of the backside via 170 is substantially flush with the surface of the source region 118a.

Figure 1H:
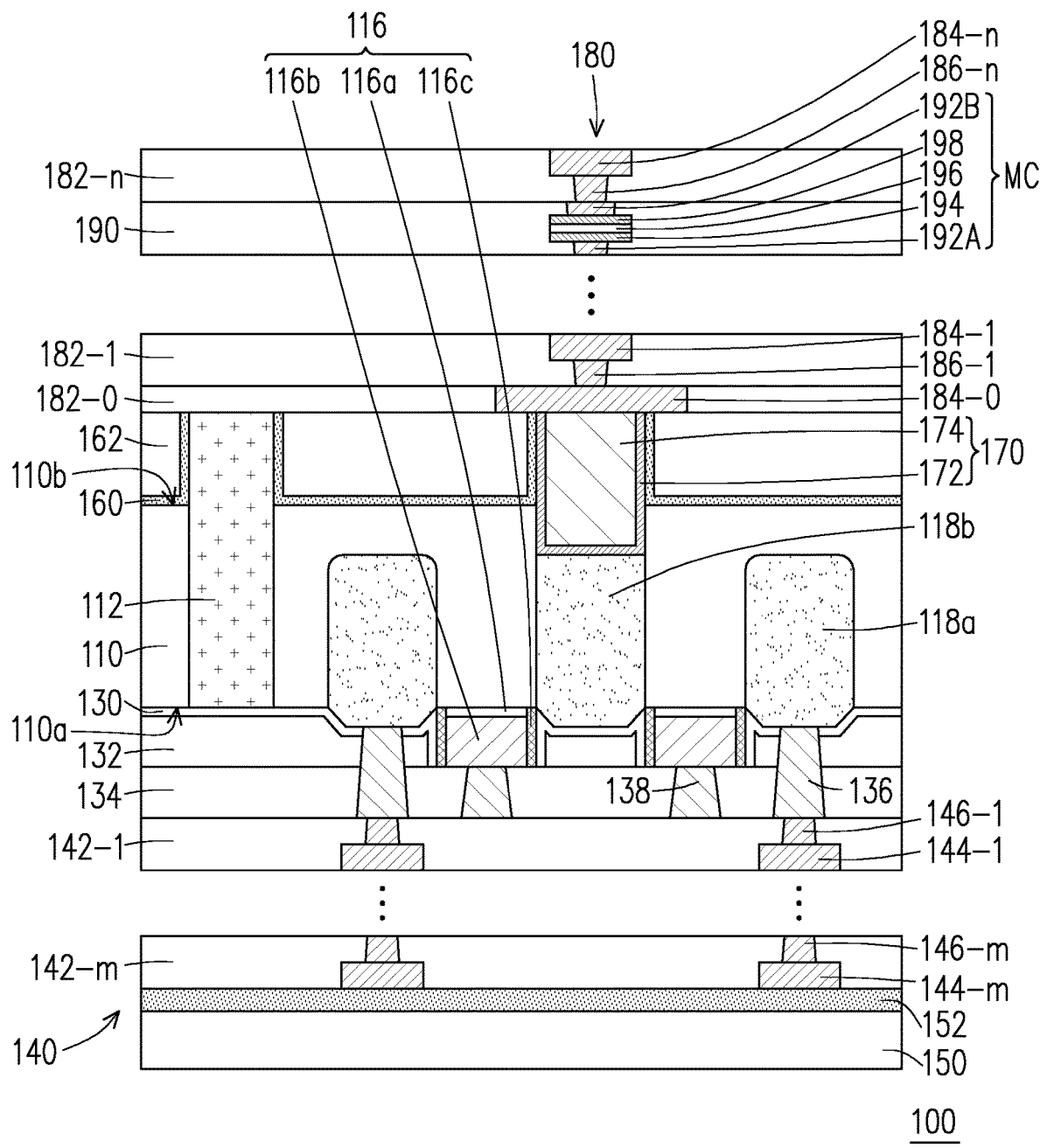

Referring to FIG. 1H, an interconnect structure 180 with a memory cell MC is formed over the second side (e.g., backside) 110b of the semiconductor substrate 110, to electrically connect to the backside via 170. Then, a semiconductor device 100 is formed. In some embodiments, the interconnect structure 180 is formed on the dielectric layer 162. The interconnect structure 180 may be referred to as a backside interconnect structure because it is formed on the backside of the semiconductor substrate 110. The interconnect structure 180 may include a plurality of dielectric layers 182-0, 182-1, . . . , 182-$n$, a plurality of interconnect wirings 184-0, 184-1, . . . , 184-$n$ and a plurality of conductive vias 186-1, . . . , 186-$n$ interconnecting the interconnect wirings 184-0, 184-1, . . . , 184-$n$. In some embodiments, n is a positive integer. For example, n is 2. However, the disclosure is not limited thereto. Each of the stacked dielectric layers 182-0, 182-1, . . . , 182-$n$ may include a dielectric material, such as a low-k dielectric material, an extra low-k (ELK) dielectric material, or the like. The dielectric layers 182-0, 182-1, . . . , 182-$n$ may be deposited using an appropriate process, such as, CVD, ALD, PVD, PECVD, or the like.

In some embodiments, the interconnect wirings 184-0, 184-1, . . . , 184-$n$ and the conductive vias 186-1, . . . , 186-$n$ are formed using a damascene process or a dual-damascene process. For example, a respective dielectric layer 182-0, 182-1, . . . , 182-$n$ is patterned utilizing a combination of photolithography and etching techniques to form trenches corresponding to the desired pattern of the interconnect wirings 184-0, 184-1, . . . , 184-$n$ and the conductive vias 186-1, . . . , 186-$n$. An optional diffusion barrier and/or optional adhesion layer may be deposited and the trenches may then be filled with a conductive material. Suitable materials for the barrier layer include titanium, titanium nitride, titanium oxide, tantalum, tantalum nitride, titanium oxide, combinations thereof, or the like, and suitable materials for the conductive material include copper, silver, gold, tungsten, aluminum, combinations thereof, or the like. In an embodiment, the interconnect wirings 184-0, 184-1, . . . , 184-$n$ and the conductive vias 186-1, . . . , 186-$n$ are formed by depositing a seed layer of copper or a copper alloy, and filling the trenches by electroplating. A chemical mechanical planarization (CMP) process or the like may be used to remove excess conductive material from a surface of the respective dielectric layer 182-0, 182-1, . . . , 182-$n$ and to planarize surfaces of the dielectric layer 182-0, 182-1, . . . , 182-$n$ and the interconnect wirings 184-0, 184-1, . . . , 184-$n$ and the conductive vias 186-1, . . . , 186-$n$ for subsequent processing. The number of the dielectric layer 182-0, 182-1, . . . , 182-$n$ illustrated in FIG. 1G is a non-limiting example, any suitable number of the dielectric layer 182-0, 182-1, . . . , 182-$n$ may be used in the backside interconnect structure 180.

In some embodiments, the memory cell MC is embedded in (or vertically inserted into) the interconnect structure 180. That is, the memory cell MC is between and in contact with adjacent two of the interconnect wirings 184-0, 184-1, . . . , 184-$n$ and the conductive vias 186-1, . . . , 186-$n$. In an embodiment in which n is 2, the memory cell MC is disposed between the interconnect wiring 184-1 and the conductive via 186-2. In alternative embodiments, the memory cell MC is disposed on and in direct contact with the interconnect wiring 184-0. In some embodiments, as shown in FIG. 1H, only the interconnect wiring 184-$n$ and the conductive via 186-$n$ are formed on the memory cell MC, and the memory cell MC is disposed between the interconnect wiring 184-($n$−1) and conductive via 186-$n$.

However, the disclosure is not limited thereto. The memory cell MC may be inserted between adjacent two of the interconnect wirings 184-0, 184-1, ..., 184-n and the conductive vias 186-1, ..., 186-n. In some embodiments, the memory cell MC is a magnetic tunnel junction (MTJ) memory cell such as a MRAM cell. The memory cell MC may be formed in a dielectric layer 190 between two adjacent dielectric layer 182-0, 182-1, ..., 182-n. The material and forming method of the dielectric layer 190 may be similar to substantially the same as the dielectric layers 182-0, 182-1, ..., 182-n. The memory cell MC may include a bottom electrode via 192A, a bottom electrode 194, a magnetic tunnel junction structure 196, a top electrode 198 and a top electrode via 192B. The bottom electrode 194 and the top electrode 198 may respectively include TiN, TaN, WN, W, Cu, Al, Ti, Ta, Ru, Co, Mo, Pt, an alloy thereof, and/or a combination thereof. Each magnetic tunnel junction structure 194 may include a synthetic antiferromagnet (SAF) structure (not shown), a nonmagnetic tunnel barrier layer (not shown), and a free magnetization layer (not shown). A nonmagnetic metallic buffer layer may be provided between the bottom electrode 194 and the magnetic tunnel junction 196. In some embodiments, a total thickness of the memory cell MC is substantially the same or similar to a total thickness of the interconnect wiring 184-1, ..., 184-n and the conductive via 186-1, ..., 186-n beneath the interconnect wiring 184-1, ..., 184-n. Similarly, a total thickness of the dielectric layer 190 may be substantially the same or similar to a total thickness of the dielectric layer 182-1, ..., 182-n. In alternative embodiments, at least one of the bottom electrode via 192A and the top electrode via 192B is omitted. In some embodiments, the memory cell MC is electrically connected to a bit line (not shown) through the interconnect structure 180. However, the disclosure is not limited thereto. Furthermore, an extending direction of the bit line may be substantially perpendicular to an extending direction of the word line. In alternative embodiments, the semiconductor device 100 is de-bonded from the carrier substrate 150 and mounted onto another substrate.

In some embodiments, the semiconductor device 100 includes the front-side interconnect structure 140 and the backside interconnect structure 180, and the memory cell MC is embedded in the backside interconnect structure 180 to electrically connect the front-side interconnect structure 140.

In some embodiments, the memory cell is formed over the backside of the semiconductor substrate. Thus, the formation of the memory cell may be combined with the formation of the backside wirings (routings) and separated from the formation of the front-side wirings. Since a total number (e.g., 3-5) of the backside wirings is less than a total number (e.g., 16-19) of the front-side wirings, the total thermal budget to the memory cell may be reduced. In addition, the total routing resistance may be reduced. Accordingly, the memory cell may have improved performance and reliability.

Figure 2:
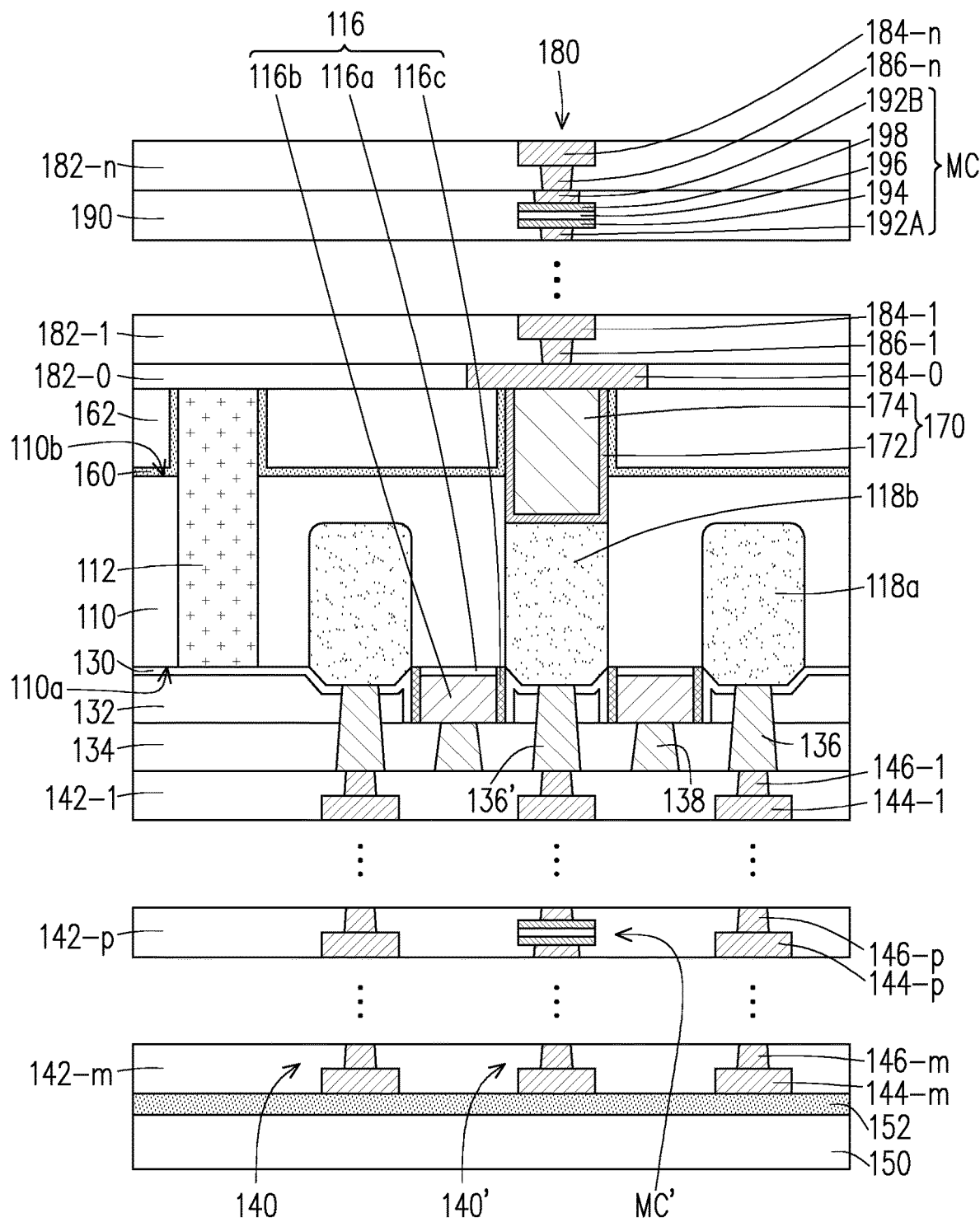
FIG. 2 is a schematic cross sectional view of a semiconductor device according to some embodiments.

In some embodiments, the memory cell is merely disposed at the backside of the semiconductor substrate. The disclosure is not limited thereto. In alternative embodiments, as shown in FIG. 2, the semiconductor device 100' is similar to the semiconductor device 100 of FIG. 1H, and the difference lies in another memory cell MC' is further formed at the front-side of the semiconductor substrate 110. Referring to FIG. 2, in some embodiments, the memory cell MC is formed over the second side 110b (i.e., backside) of the semiconductor substrate 110, and the memory cell MC' is formed over the first side 110a (i.e., front-side) of the semiconductor substrate 110. In some embodiments, the interconnect structure 140 is formed over and electrically connected to the source region 118a, and an interconnect structure 140' is formed over and electrically connected to the drain region 118b through a drain contact 136'. The interconnect structure 140' may be similar to the interconnect structure 140 and may be formed simultaneously with the interconnect structure 140. The difference lies in the memory cell MC' is embedded in the interconnect structure 140'. For example, the interconnect structure 140 includes the dielectric layers 142-1, ..., 142-p, ..., 142-m, the interconnect wirings 144-1, ..., 144-p, ..., 144-m and the conductive vias 146-1, ..., 146-p, ..., 146-m interconnecting the interconnect wirings 144-1, ..., 144-p, ..., 144-m, and the interconnect structure 140' includes the interconnect wirings 144-1, ..., 144-m and the conductive vias 146-1, ..., 146-m interconnecting the interconnect wirings 144-1, ..., 144-m. In such embodiments, the memory cell MC' is disposed between and in direct contact with adjacent two of the interconnect wiring and the conductive via. In some embodiments, the memory cell MC' is disposed at the same height as the conductive vias 146-p and the interconnect wiring 144-p. In some embodiments, a total thickness of the memory cell MC' is substantially the same as a total thickness of the conductive vias 146-p and the interconnect wiring 144-p. In some embodiments, p is 7, and m is larger than 12. However, the disclosure is not limited thereto. The interconnect structure 140' may include any number of interconnect wirings disposed in any number of dielectric layers, and the memory cell MC' may be embedded in any adjacent two of the interconnect wirings and the conductive vias. In such embodiments, the memory cells are disposed at both front-side and backside of the semiconductor substrate (i.e., wafer), and thus the memory capacity may be doubled in the same area. Furthermore, in some embodiments, after forming the memory cell MC', a plurality of interconnect wiring (e.g., the interconnect wirings 144-(p+1) to 144-m) are formed over the memory cell MC' sequentially, and thus the memory cell MC' has to undergo many thermal processes. On contrary, after forming the memory cell MC, few interconnect wiring (e.g., the interconnect wiring 184-n) is formed on the memory cell MC, and thus the memory cell MC' undergoes few thermal process. In other words, in some embodiments, compared to the memory cell inserted into the frontside wiring structure, the memory cell formed with the backside wiring structure may be prevented from undergoing thermal process repeatedly. Accordingly, the performance of the memory cell MC is improved.

Figure 3:
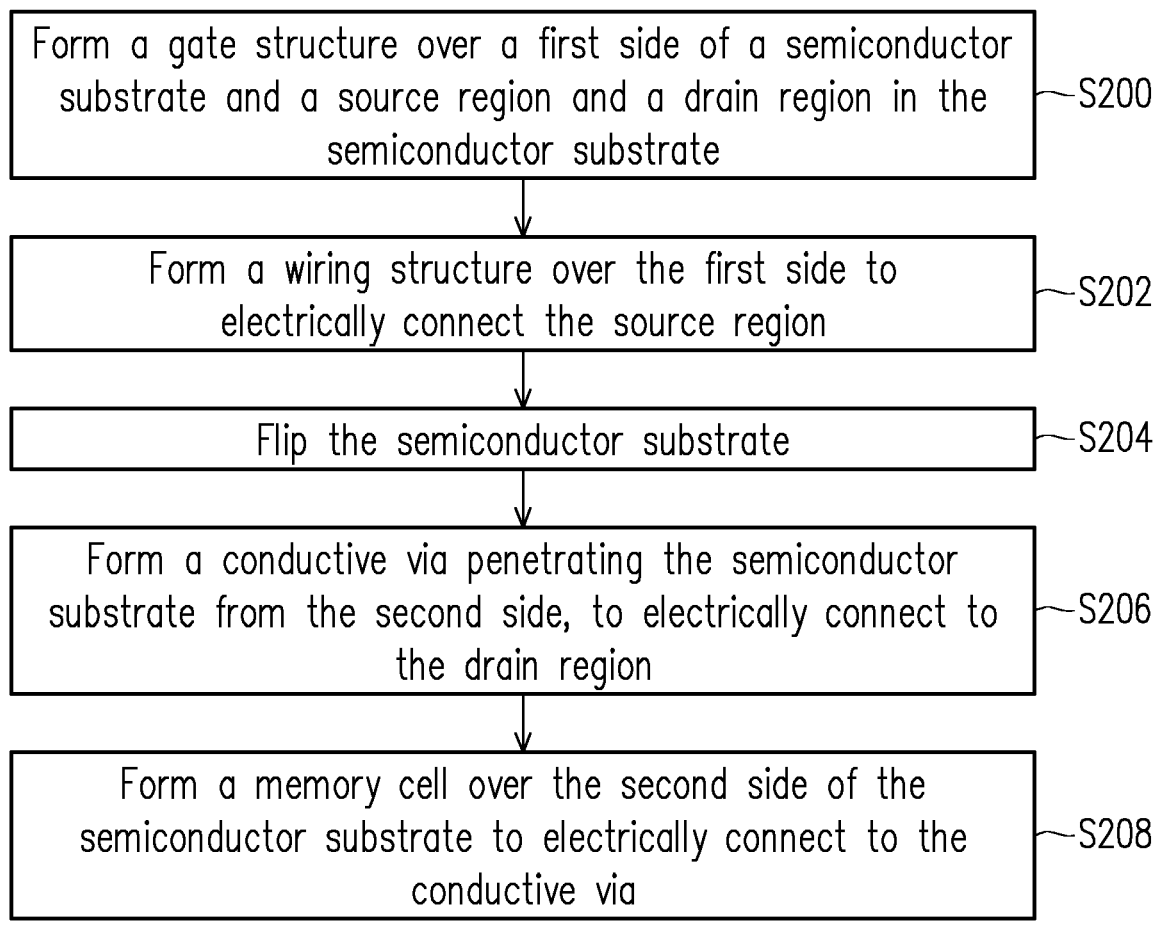
FIG. 3 illustrates a method of forming a semiconductor device in accordance with some embodiments.

FIG. 3 illustrates a method of forming a semiconductor device in accordance with some embodiments. Although the method is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act S200, a gate structure is formed over a first side of a semiconductor substrate and a source region and a drain region in the semiconductor substrate. FIG. 1A and FIG. 2 illustrate varying views corresponding to some embodiments of act S200.

At act S202, a wiring structure is formed over the first side to electrically connect the source region. FIG. 1B and FIG. 2 illustrate varying views corresponding to some embodiments of act S202.

At act S204, the semiconductor substrate is flipped. FIG. 1C and FIG. 2 illustrate varying views corresponding to some embodiments of act S204.

At act S206, a conductive via is formed from the second side to penetrate the semiconductor substrate, to electrically connect to the drain region. FIGS. 1C to 1G and FIG. 2 illustrate varying views corresponding to some embodiments of act S206.

At act S208, a memory cell is formed over the second side of the semiconductor substrate to electrically connect to the conductive via. FIG. 1H and FIG. 2 illustrate varying views corresponding to some embodiments of act S208.

In accordance with some embodiments of the disclosure, a semiconductor device includes a semiconductor substrate, a gate structure, a source region, a drain region, an interconnect structure, a memory cell and a conductive via. The semiconductor substrate has a first side and a second side opposite to the first side. The gate structure is disposed over the first side of the semiconductor substrate. The source region and the drain region are disposed in the semiconductor substrate aside the gate structure. The interconnect structure is disposed over the first side of the semiconductor substrate and electrically connected to the source region. The memory cell is disposed over the second side of the semiconductor substrate and electrically connected to the drain region. The conductive via is disposed in the semiconductor substrate between the drain region and the memory cell and electrically connects the drain region and the memory cell.

In accordance with some embodiments of the disclosure, a semiconductor device includes a semiconductor substrate, a source region, a drain region, a first wiring structure a second wiring structure, a conductive via, a first memory cell and a second memory cell. The semiconductor substrate has a first side and a second side opposite to the first side. The source region and the drain region are disposed in the semiconductor substrate. The first wiring structure includes a plurality of first wirings, and disposed over the first side of the semiconductor substrate and electrically connected to the drain region. The second wiring structure includes a plurality of second wirings, and disposed over the second side of the semiconductor substrate and electrically connected to the drain region. The conductive via is disposed in the semiconductor substrate between the drain region and the second wiring structure. The first memory cell is disposed over the first side and between and electrically connected to the plurality of first wirings. The second memory cell is disposed over the second side, and disposed between and electrically connected to the plurality of second wirings.

In accordance with some embodiments of the disclosure, a method of manufacturing a semiconductor device includes the following steps. A gate structure is formed over a first side of a semiconductor substrate and a source region and a drain region in the semiconductor substrate. A first wiring structure is formed over the first side to electrically connect the source region. The semiconductor substrate is flipped. A conductive via is formed from the second side to penetrate the semiconductor substrate, to electrically connect to the drain region. A memory cell is formed over the second side of the semiconductor substrate to electrically connect to the conductive via.

In accordance with some embodiments of the disclosure, a semiconductor device includes a substrate, a gate structure, a source region and a drain region, a conductive via and an isolation structure. The gate structure is disposed over the substrate. The source region and the drain region aside the gate structure. The conductive via is disposed in the substrate. The isolation structure is disposed in the substrate, wherein a first surface of the isolation structure is substantially flush with a first surface of the conductive via.

In accordance with some embodiments of the disclosure, a semiconductor device includes a substrate, a transistor, a first wiring structure, a second wiring structure, a first memory cell and a second memory cell. The substrate has a first side and a second side opposite to the first side. The transistor is disposed in the substrate. The first wiring structure includes a plurality of first wirings, and is disposed over the first side of the substrate and electrically connected to the transistor. The second wiring structure includes a plurality of second wirings, and is disposed over the second side of the substrate and electrically connected to the transistor. The first memory cell is disposed over the first side, wherein the first memory cell is disposed between and electrically connected to the plurality of first wirings. The second memory cell is disposed over the second side, wherein the second memory cell is disposed between and electrically connected to the plurality of second wirings.

In accordance with some embodiments of the disclosure, a method of manufacturing a semiconductor device includes the following steps. A gate structure is formed over a first side of a substrate and a source region and a drain region are formed in the substrate. A dummy contact is formed in the substrate between the second side and the drain region, wherein the dummy contact is in direct contact with the drain region. The dummy contact is replaced with a conductive via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate;
   a gate structure over the substrate;
   a source region and a drain region aside the gate structure;
   a conductive via, disposed in the substrate; and
   an isolation structure, disposed in the substrate, wherein a first surface of the isolation structure is substantially flush with a first surface of the conductive via, wherein the first surfaces of the isolation structure and the conductive via protrude from the substrate.

2. The semiconductor device according to claim 1, further comprising a first dielectric layer over the substrate, wherein the isolation structure and the conductive via are disposed in the first dielectric layer, and the first surfaces of the isolation structure and the conductive via are substantially flush with a first surface of the first dielectric layer.

3. The semiconductor device according to claim 2, further comprising a second dielectric layer between the first dielectric layer and the substrate, between the first dielectric layer and the isolation structure and between the first dielectric layer and the conductive via.

4. The semiconductor device according to claim 1, wherein the conductive via is in direct contact with the drain region.

5. The semiconductor device according to claim 1, wherein the conductive via is disposed between and electrically connected the drain region and a memory cell.

6. The semiconductor device according to claim 1, further comprising an interconnect structure disposed over the substrate and electrically connected to the source region.

7. The semiconductor device according to claim 1, further comprising a plurality of conductive patterns vertically stacked on and electrically connected to the conductive via, and a memory cell vertically inserted between and in direct contact with adjacent two of the plurality of conductive patterns.

8. A semiconductor device, comprising:
a substrate, having a first side and a second side opposite to the first side;
a transistor in the substrate;
a first wiring structure comprising a plurality of first wirings, disposed over the first side of the substrate and electrically connected to the transistor;
a second wiring structure comprising a plurality of second wirings, disposed over the second side of the substrate and electrically connected to the transistor;
a first memory cell disposed over the first side, wherein the first memory cell is disposed between and electrically connected to the plurality of first wirings; and
a second memory cell disposed over the second side, wherein the second memory cell is disposed between and electrically connected to the plurality of second wirings.

9. The semiconductor device according to claim 8, wherein the plurality of first wirings are stacked on one another, and the first memory cell is inserted into and in direct contact with adjacent two of the plurality of first wirings.

10. The semiconductor device according to claim 8, wherein the plurality of second wirings are stacked on one another, and the second memory cell is inserted into and in direct contact with adjacent two of the plurality of second wirings.

11. The semiconductor device according to claim 8, further comprising a third wiring structure over the first side of the substrate and electrically connected to a source region of the transistor, wherein the third wiring structure comprises a plurality of third wirings, a bottom surface of the first memory cell is substantially coplanar with a bottom surface of one of the plurality of third wirings, and a top surface of the first memory cell is substantially coplanar with a top surface of another of the plurality of third wirings.

12. The semiconductor device according to claim 8, further comprising a conductive via disposed between and in direct contact with the transistor and the second wiring structure.

13. The semiconductor device according to claim 12, further comprising a first dielectric layer over the second side, wherein the conductive via is disposed in the first dielectric layer, and the conductive via has a first surface substantially coplanar with a surface of the first dielectric layer and a second surface opposite to the first surface and substantially coplanar with a surface of a source region of the transistor.

14. A semiconductor device, comprising:
a semiconductor substrate;
a first doped region in the semiconductor substrate;
a memory cell electrically connected to the first doped region; and
a conductive via, disposed in the semiconductor substrate and disposed between the first doped region and the memory cell along a first direction, wherein the conductive via is in direct contact with the first doped region.

15. The semiconductor device according to claim 14, further comprising a second doped region and a first wiring structure electrically connected to the second doped region, wherein the first doped region and the second doped region are arranged along a second direction substantially perpendicular to the first direction, and the first wiring structure and the memory cell are disposed at opposite sides of the semiconductor substrate.

16. The semiconductor device according to claim 15, further comprising a second wiring structure disposed between the memory cell and the conductive via along the first direction.

17. The semiconductor device according to claim 14, wherein a sidewall of the conductive via is substantially flush with a sidewall of the first doped region.

18. The semiconductor device according to claim 14, further comprising a dielectric layer between the semiconductor substrate and the memory cell, wherein a surface of the dielectric layer is substantially coplanar with a surface of the conductive via facing the memory cell.

19. The semiconductor device according to claim 14, further comprising a silicide layer on a sidewall of the conductive via and at an interface of the conductive via and the first doped region.

20. The semiconductor device according to claim 14, wherein the conductive via is stacked on the first doped region along the first direction.

* * * * *